March 8, 1966 R. L. CARBREY 3,239,765

PHASE SHIFT COUNTING CIRCUITS

Filed Sept. 25, 1963 4 Sheets-Sheet 1

(PULSE DIVIDER)

(PHASE DISPLACEMENT COUNTER)

INVENTOR
R. L. CARBREY
BY L. O. Nimz
ATTORNEY

March 8, 1966 R. L. CARBREY 3,239,765

PHASE SHIFT COUNTING CIRCUITS

Filed Sept. 25, 1963 4 Sheets-Sheet 2

PHASE SHIFT COUNTING CIRCUITS

Filed Sept. 25, 1963 4 Sheets-Sheet 3

March 8, 1966 R. L. CARBREY 3,239,765

PHASE SHIFT COUNTING CIRCUITS

Filed Sept. 25, 1963 4 Sheets-Sheet 4

United States Patent Office 3,239,765
Patented Mar. 8, 1966

3,239,765

PHASE SHIFT COUNTING CIRCUITS

Robert L. Carbrey, Madison, N.J., assignor to Bell Telephone Laboratories, Incorporated, New York, N.Y., a corporation of New York Filed Sept. 25, 1963, Ser. No. 311,526
21 Claims. (Cl. 328—40)

This invention relates to counting circuits, and more particularly, to phase displacement counters of arbitrary radix.

In the copending application of the present applicant, Serial No. 311,529, filed of even date herewith, there is disclosed one species of phase displacement counters. A phase displacement counter is therein defined as a counting circuit in which the numerical significance (digit value) of the output is determined by the phase of a train of pulses on a single output lead. Such a counting circuit has advantages over conventional counting circuits in that all stages of the counter have substantially the same duty factor, are subjected to similar driving sequences, and provide substantially identical output waveforms. Moreover, the stages of the counter can be realized with simple circuitry including only a single active element. Finally, alternating current coupling is possible for all states of the counter and for any state duration, and for binary radix counters, inversion of any digit is possible with a simple transformer.

The phase displacement counters disclosed in applicant's aforementioned copending application include pulse divider stages each arranged to divide an incoming clock pulse train by the radix of the numbering system being used. Single transistor blocking oscillator pulse dividers are suitable for this purpose. A change in state of any stage is made merely by inhibiting the application of a single clock pulse which would otherwise trigger the stage. The stage then begins to divide on the next succeeding clock pulse, which is in the next succeeding phase and hence representative of a different digit value.

Unfortunately, changing the state of a counter stage by inhibiting the application of an input clock pulse has the disadvantage of requiring rather complicated input logic circuitry including many expensive pulse delay circuits. One of the major advantages of this type of counter, i.e., circuit simplicity, is thereby thwarted.

It is an object of the present invention to reduce the cost and complexity of phase displacement counters by means of simple, economical input circuitry.

It is a more specific object of the invention to alter the state of a phase displacement counter by temporarily altering the division ratio of that stage rather than inhibiting the application of a clock pulse.

In accordance with the present invention, a multistage phase displacement counter is provided having stages each including a simple pulse divider. The pulse divider of each stage includes reactive circuit means for controlling the countdown ratio. Gating means are provided to temporarily alter this ratio, either by increasing or decreasing it, and thus render the stage responsive to a clock pulse in an earlier phase period (ratio decreased) or to a clock pulse in a later phase period (ratio increased). In either case, the phase of the output changes, and the change in phase can be regarded as an increase in digit value.

More specifically, if transistor blocking oscillators are used in the individual stages of the counters, the recovery time is controlled by the amount of energy stored in the reactive elements, and the decay time of this energy. The amount of energy stored, in turn, depends upon the current supplied to the reactive elements. The decay time, on the other hand, depends on the discharge time constant of reactive element decay circuit. By use of suitable gates, each of these quantities can be increased or decreased sufficiently to alter the division ratio by a selected number of clock pulse intervals.

The major advantage of the present invention over the circuits disclosed in applicant's aforementioned copending application is the large reduction of circuit complexity made possible by division ratio alternation. In addition, advancing a stage can be accomplished by going to a preceding clock pulse phase as well as to a following clock pulse phase.

These and other objects and features, the nature of the present invention and its various advantages, will be more readily understood upon consideration of the attached drawings and the following detailed description of the drawings.

Figure 1:
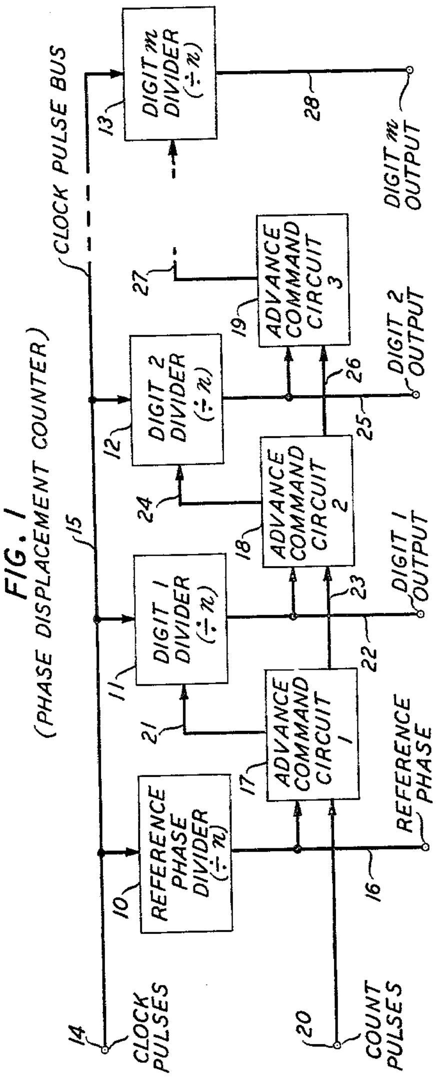
FIG. 1 is a general block diagram of a phase displacement counter with dividing ratio modification in accordance with the present invention.

Referring more particularly to FIG. 1, there is shown a general block diagram of a phase displacement counter in accordance with the present invention comprising a plurality of pulse divider circuits 10, 11, 12, and 13. Divider circuits 10 through 13 are all essentially identical and each comprises circuit means to divide an incoming clock pulse train, applied to clock pulse terminal 14 and appearing on clock pulse bus 15, by the dividing ratio $n$, i.e., to produce an output pulse only once for each $n$ input pulses. Blocking oscillators, ring counters and many monostable circuits can be used as pulse dividers and any one of these circuits would be suitable for dividers 10 through 13. The value of the division ratio $n$ is equal to the radix of the numbering system to be counted in and is the same for all of the dividers 10 through 13.

A phase displacement counter such as that shown in FIG. 1 differs from other types of counters in that the value of each digit output is represented by the relative phase of a continuous train of output pulses from that stage, rather than by the magnitude of a static output, such as provided by a conventional binary counter, or by the spatial position of an output, such as provided by a ring counter. As noted above, the advantages of this type of counter output are that all stages produce like outputs, the outputs can be coupled by alternating current coupling circuits, the stages can be operated with a low duty factor and, in most cases, the circuitry is simpler and less costly than comparable circuits of other types.

The first divider circuit 10 in FIG. 1 produces a train of pulses on output lead 16 which serves as a reference phase. That is, the pulse output of divider 10 is always in a given phase, and that phase serves as the zero or reference phase. All of the other divider circuits 11, 12, . . . 13 comprise active stages of the counting circuit.

Between the divider stages of the counter of FIG. 1 are a plurality of advance command circuits 17, 18, and 19. These circuits perform the logic required to decide when the connected stage is to be advanced. The first advance command circuit 17 has as inputs the reference phase pulses on lead 16 and count pulses from count input terminal 20. The first digit divider 11, of course, must be "advanced" for each count pulse at input terminal 20. In accordance with the present invention, output lead 21 is connected to divider 11 to temporarily alter its division ratio by a selected amount.

Similarly, advance command circuit 18, energized by the output of circuits 11 and 17 on leads 22 and 23, respectively, provides an output on lead 24 to temporarily alter the division ratio of divider 12 by the same amount. The rules of counting, however, require that divider 12 advance only once for each complete cycle of divider 11. This occurs each time divider 11 returns to the reference phase.

Advance command circuit 19 is energized from divider 12 and circuit 18 by way of output leads 25 and 26, respectively, and produces an output command on lead 27 once for each complete cycle of divider 12. The output on lead 27 temporarily alters the division ratio of the next succeeding divider by the same amount as dividers 11 and 12 are altered. Similarly, divider 13 is altered once for each complete cycle of the next preceding divider by this same amount, and produces an output in lead 28.

Figure 2C:
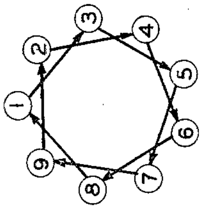
FIGS. 2A, 2B and 2C are examples of phase sequence charts useful in understanding the operation of the counter circuit of FIG. 1.

A careful distinction must be made between "advancing" the state of a counter stage, which merely indicates movement to the phase representing the next higher digit value, and "advancing" the phase of the output. In point of fact, the next higher digit value can be almost any possible phase other than the present phase. Thus, the counter can be "advanced" by advancing the phase position of the output or by retarding the phase position of the output. The change in counter state, of course, must follow the advance command, but the new phase can be earlier or later in time than the old phase. This can better be seen in connection with FIGS. 2A through 2C.

Figure 2B:
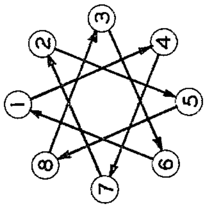
Figure 2A:
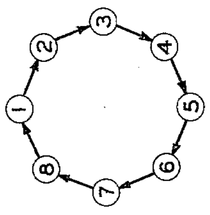

In FIG. 2A there is shown a phase sequence chart for a phase displacement counter such as that shown in FIG. 1. For purposes of illustration, it is assumed that each divider divides by a ratio of 8:1, i.e., there are eight unique digit value-representing phases. These phases have been labelled "1," "2," "3," etc.

It can be assumed that these phases appear in time in the same order as they are numbered. The arrows between the numbers indicate one sequence for advancing the stages of the counter through these eight phases. In this case, the phase is advanced in time by one phase position for each transition in digit value. The dividers must therefore be arranged to temporarily increase their division ratios by one for each digit value change in order to begin dividing in the next later phase, i.e., on the next succeeding clock pulse after the clock pulse which would normally trigger that divider.

It is clear, however, that the phases could be ordered in time inversely with respect to the order of their numbers. In this case, the phase is retarded in time by one phase position for each transition in digit value. The divider must then be arranged to temporarily decrease their division ratios by one for each digit value change in order to begin dividing in the next preceding phase i.e., on the clock pulse next preceding that which would normally trigger the divider.

Since the actual phase of the divider outputs can be assigned more or less arbitrary digit values, other phase sequences are possible. In FIG. 2B, for example, the ordering of the numbers again follows the time sequence of the phases. In this case, however, the dividers are arranged to increase their division ratios by three for each advance in value. It can be seen that this generates the sequence of phases "1-4-7-2-5-8-3-6" in a repetitive pattern. Moreover, this pattern can be obtained by either increasing the division ratio by three or decreasing the division ratio by three. Indeed, analysis will show that, for any number $n$ of possible digit values, an advance or retard by any integral number of phases which is not, nor does not contain, an integral factor in common with the radix $n$ will produce a repetitive sequence including all of the possible phases once and only once. One such phase sequence for nine phases and an advance of two phase positions is shown in chart form in FIG. 2C.

Figure 3:
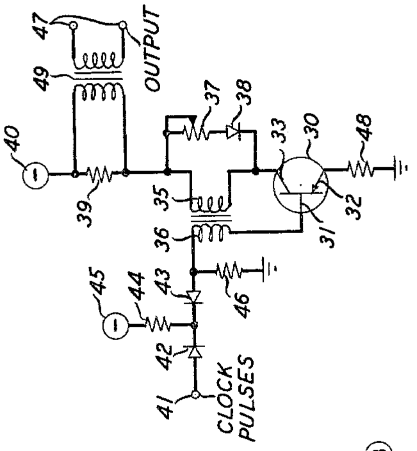
FIG. 3 is a schematic circuit diagram of a transistor blocking oscillator suitable as a pulse divider in the arrangements of the present invention.

In FIG. 3 there is shown one type of pulse divider circuit which is particularly useful for phase displacement counters of the form shown in FIG. 1. FIG. 3 discloses a transistor blocking oscillator comprising a transistor 30 including a base electrode 31, an emitter electrode 32 and a collector electrode 33. The base and collector electrodes are coupled in regenerative feedback relation by a feedback transformer 34 having a primary winding 35, connected to collector electrode 33, and a secondary winding 36, connected to base electrode 31. A variable resistor 37 and a diode 38 are connected in series across primary winding 35. A load resistor 39, in parallel with the primary winding of output transformer 49, connects primary winding 35 to a bias supply source 40. Emitter 32 is returned to ground through an emitter load resistor 48.

Clock pulses are applied to input terminal 41 of the pulse divider of FIG. 3, and thence to an isolation gate comprising diodes 42 and 43, biased through resistor 44 from source 45 and returned to ground through resistor 46. The output of the pulse divider appears at output terminals 47, connected across the secondary winding of output transformer 49.

The blocking oscillator action occurs in the circuit of FIG. 3 due to the regenerative feedback transformer 34. A negative-going clock pulse, applied to base electrode 31 through the isolation gate and the secondary winding 36, biases transistor 30 into a conducting condition. Collector current flowing through primary winding 35 is coupled to secondary winding 36 in such a sense as to drive transistor 30 further into conduction. This regenerative action rapidly builds up current through transistor 30 to the maximum value it can sustain under the existing circuit conditions. With this maximum current value, collector 33 is nearly at the same potential as emitter 32 and substantially the entire voltage appears across winding 35.

When the current through transistor 30 can no longer increase, the voltage across winding 35 suddenly drops to zero and reverses, and this voltage transient is coupled through transformer 34 to turn transistor 30 off. The energy stored in the field of transformer 34 is dissipated by current flow through resistor 37 and diode 38. This current flows through diode 38 and resistor 37 until it has decayed to a value insufficient to maintain the forward bias on diode 38. During this decay interval, transformer 34 will be effectively short-circuited. That is, clock pulse applied to the input terminal 41 during this interval will be insufficient to overcome the reverse voltage in winding 36 and thus trigger the circuit. Following the decay interval, however, the next clock pulse will retrigger the circuit through the same cycle of operation. Thus the blocking oscillator circuit of FIG. 3 will produce an output pulse once for each plurality of input pulses. The ratio of input pulses to output pulses, i.e., the dividing ratio, can be controlled over wide ranges.

It can easily be seen that the decay time of current in winding 35 is dependent on two things: the amount of energy initially stored in the field of transformer 34, and the time constant of the circuit traversed by the decay current. The amount of energy in the field of transformer 34, in turn, depends on the amount of current drawn through transistor 30. The time constant of the decay circuit, of course, is controlled by the value of resistor 37, together with the inductance of transformer 34. The larger the value of resistor 37, the faster will the decay current decrease. The maximum decay interval occurs when resistor 37 is zero and only diode 35 remains in the circuit.

The circuit of FIG. 3 will operate on negative-going input clock pulses having a repetition rate of up to ten megabits per second and a pulse width of fifty nanoseconds (.05 microsecond) with the following circuit values:

| | |
|---|---|
| Voltage supplies **40**, **45** | 15 volts. |
| Transistor **30** | Type 2N1500. |
| Diodes **38**, **42**, **43** | Type 1N497. |
| Resistor **37** | 0–220 ohms. |
| Resistor **39** | 200 ohms. |
| Resistor **44** | 1500 ohms. |
| Resistor **46** | 100 ohms. |
| Resistor **48** | 10 ohms. |
| Transformer **34** | ¼" ferrite cup core with a six turn primary winding **35** and a three turn secondary winding **36**, selected for desired division ratio; inductance=approx. 2.5 μh. |

When resistor 37 is adjusted for minimum value and transformer 34 has an inductance of several millihenries, dividing ratios of several hundred are possible. For stable repetition of the dividing ratio, however, the dividing ratio should not exceed about twenty.

In accordance with the present invention, a phase displacement binary counter such as that shown in FIG. 1 is advanced by temporarily modifying the division ratio of the pulse dividers in the various stages. For the purposes of illustration, circuits will now be described for temporarily modifying the division ratios of transistor blocking oscillator pulse dividers similar to that shown in FIG. 3. It is clear, however, that other types of pulse dividers could be similarly modified by analogous circuitry. Furthermore, it is also clear that the basic pulse divider could utilize a NPN transistor rather than a PNP transistor by a simple change in bias voltage polarity and corresponding changes in the polarities of other circuit components.

Figure 4:
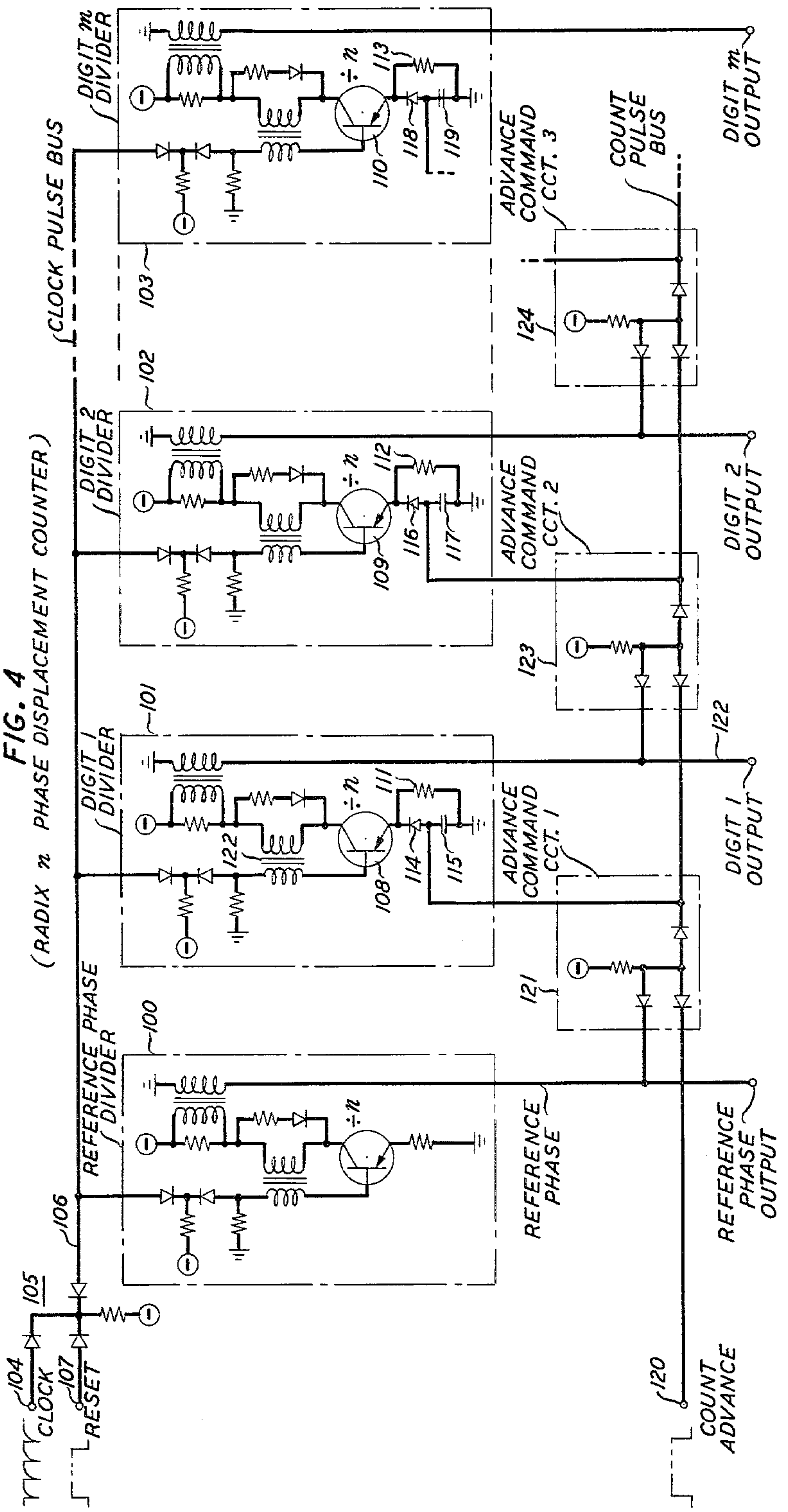
FIG. 4 is a schematic circuit diagram of a phase displacement counter in accordance with the invention and including an emitter controlled pulse lengthening circuit.

Turning then to FIG. 4, there is shown a schematic circuit diagram of one phase displacement binary counter in accordance with the present invention in which the division ratios of the basic pulse dividers are temporarily increased by increasing the amount of energy stored in the field of the feedback transformer of transistor blocking oscillator pulse dividers. The counter of FIG. 4 comprises a reference phase pulse divider 100 and a plurality of digit dividers 101, 102, . . . 103. Most of the circuitry of these pulse dividers is identical to that of FIG. 3 and will not be described in detail. Each of dividers 100, 101, 102, . . . 103, is arranged normally to divide by a ratio of $n$, the radix of the numbering system in which the counter is to operate.

Clock pulses at input terminal 104 are applied to a normally enabled reset gate 105 and thence to clock pulse bus 106. There is also applied to reset gate 105 a reset pulse from input terminal 107. Reset pulses at terminal 107 disable reset gate 105 so as to prevent the application of clock pulses to bus 106 for the duration of the reset pulse. The reset pulse is made equal in length to at least $n$ clock pulse periods. Thus, dividers 100 through 103 are all allowed to time out and return to their triggerable condition, and all will trigger, simultaneously and in the same phase, on the first clock pulse following the termination of the reset pulse. In this way, all of the stages are synchronized in the reference or zero phase and the counter is reset to zero.

Digit dividers 101, 102, . . . 103 differ from the divider of FIG. 3 only in the emiter load circuit connected to their respective transistors 108, 109, . . . 110. Rather than having only the resistor emitter loads 111, 112, . . . 113, each includes a parallel circuit including a diode and a capacitor connected in series. Thus diode 114 and capacitor 115 are connected in parallel with resistor 111, diode 116 and capacitor 117 are connected in parallel with resistor 112, and diode 118 and capacitor 119 are connected in parallel with resistor 113. Diodes 114, 116, . . . 118 are all poled in the same direction as the emitters of transistors 108, 109, . . . 110, respectively.

Considering digit divider 101 as typical, it can be seen that the first clock pulse to trigger transistor 108 will cause a charge to build up on capacitor 115 due to the emitter current flow. When transistor 108 turns off, the voltage on capacitor 115 will be of such a polarity as to reverse bias diode 114. On all succeeding clock pulses, diode 114 will remain reverse biased and capacitor 115 will effectively be out of the circuit and the effective emitter load will be only resistor 111.

When it is desired to advance the counter of FIG. 4, a positive-going count pulse is applied to input terminal 120 of sufficient duration to overlap $n$ clock pulse periods. This count pulse is applied to AND gate 121 together with a positive-going output from reference phase divider 100. The output of AND gate 121 therefore comprises count pulses indexed in the reference phase.

Each output pulse from AND gate 121 is of such a polarity and magnitude as to remove some or all of the charge on capacitor 115. When transistor 108 is next triggered, diode 114 is again biased in the forward direction and capacitor 115 acts as a low impedance current source until such time as the voltage thereon builds up sufficiently to reverse bias diode 114. Under this condition, transistor 108 conducts a greater amount of current to transformer 122 which increases the flux density of the transformer field, and hence the amount of energy stored in the field. Following the turn-off of transistor 108, this greater energy will require a longer time to dissipate and hence transistor 108 will be unable to retrigger for an added interval. This added interval can be adjusted to one clock pulse period by adjusting the value of capacitor 115. Alternatively, as discussed above, this interval can be adjusted to any number of clock pulse intervals which does not contain an integral factor in common with the radix $n$.

Digit divider 101 continues to sequentially alter its phase in steps, one step for each count pulse applied to terminal 120. It should be noted that, even when divider 101 is counting in the reference phase, the removal of charge from capacitor 115 is still possible during this phase and while transistor 108 is still conducting, and will insure the proper increase in division ratio. Moreover, the current drawn by transistor 108 when it does fire restores the charge to capacitor 115 and pulse division thereafter recurs at the orignial rate $n$.

When the output of divider 101 is shifted through a complete cycle of phases and returns to the reference phase, the positive-going output on lead 122 will complete the enablement of AND gate 123 whenever a reference phase count pulse is available from AND gate 121. Divider 102 will then advance one phase position by the same mechanism that divider 101 advances. Divider 102, however, will advance only on those counts in which divider 101 moves from the reference phase to the next succeeding phase, i.e., one phase step for each full cycle of divider 101. Similarly, AND gate 124 will be fully enabled only when divider 102 is in the reference phase and a count pulse is present. Thus the divider following divider 102 will advance only once for each full cycle of divider 102.

Finally, the last divider 103 will advance by the same mechanism only once for each full cycle of the next preceding divider. Each of stages 110, 102, . . . 103, of course, is arranged to increase its dividing ratio by exactly the same number of clock pulse periods.

Figure 5:
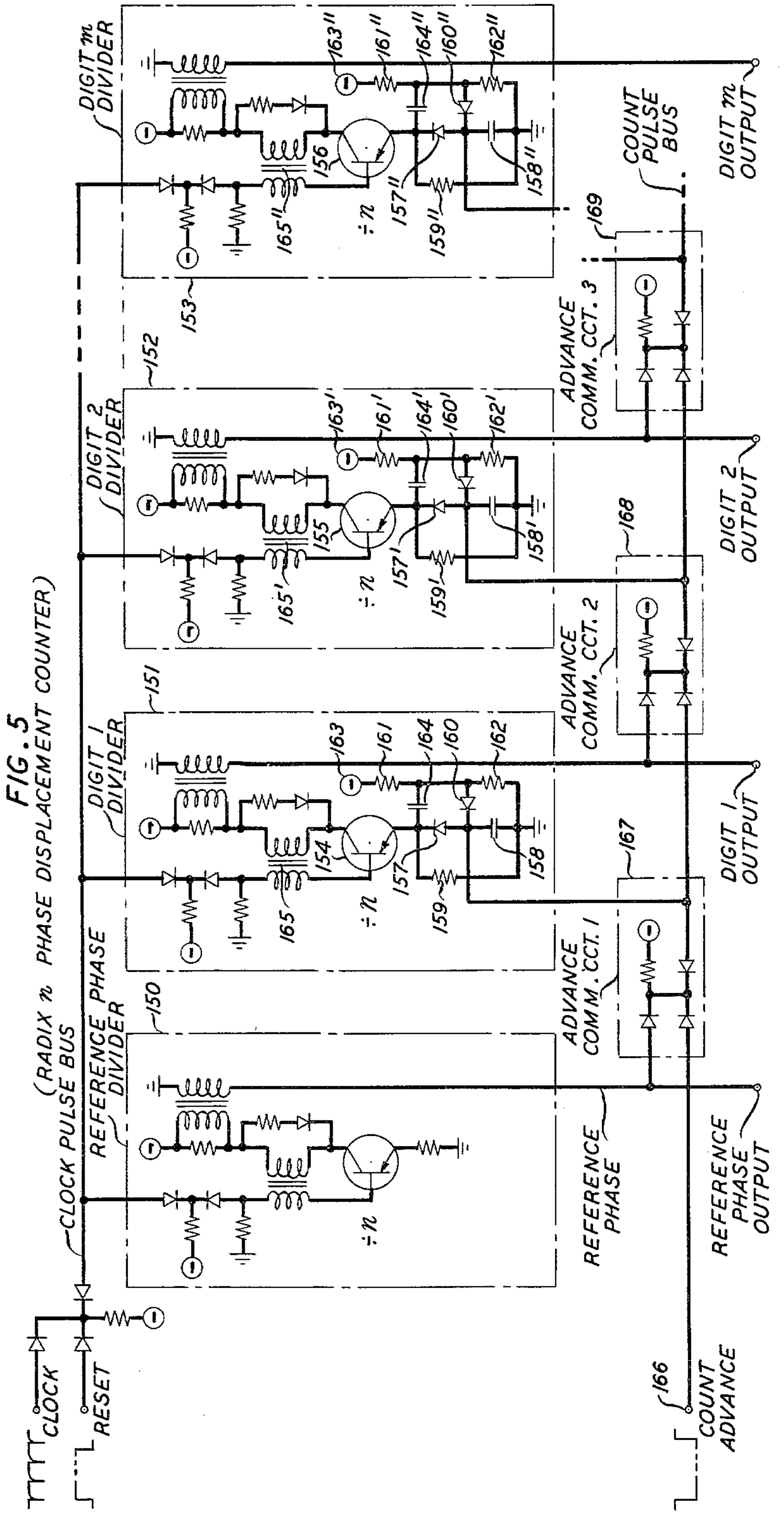
FIG. 5 is a schematic circuit diagram of a phase displacement counter including an emitter controlled pulse shortening circuit.

In FIG. 5 there is shown a phase displacement counter similar to that of FIG. 4, but which advances by decreasing the dividing ratios of the stages. The counter in FIG. 6 comprises a reference phase pulse divider 150 and a plurality of digit dividers 151, 152, . . . 153. The individual pulse dividers 150, 151, 152, . . . 153, are very similar to that of FIG. 3 and, as in FIG. 4, are arranged to divide incoming clock pulses by the radix $n$ of the numbering system.

The digit dividers of FIG. 5 differ from those of FIG. 4 in the emitter load circuits connected to transistors 154, 155, . . . 156. In addition to having a diode and capacitor connected in parallel with the load resistor, a second diode and a second capacitor, together with a voltage divider across the bias supply, appear in each emitter circuit. Thus, in divider circuit 151, a diode 157 and a capacitor 158 are connected in parallel with load resistor 159 betwen the emitter of transistor 154 and ground. This much of the arrangement is identical to FIG. 4. In addition, however, a second diode 160 is connected between the midpoint of diode 157 and capacitor 158 and the midpoint of a voltage divider comprising resistors 161 and 162 connected to voltage source 163. A capacitor 164 is connected from the emitter of transistor 154 to the same midpoint on the voltage divider comprising resistors 161 and 162. The emitter circuits of dividers 152 and 153 are identical and hence have been identified with the same reference numerals, but with primes and double primes, respectively.

The operation of the digit divider 151 in FIG. 5 is initially the same as that of divider 101 in FIG. 4. The first clock pulse to trigger transistor 154 causes a charge to build up on capacitor 158 due to emitter current flow. When transistor 154 turns off, a positive-going overshoot at the emitter is coupled by capacitor 164 to bias diode 160 into its forward conducting condition. Diode 160 and resistor 162 provide a discharge path for capacitor 158 which therefore discharges back to its normal uncharged condition. This discharge is sufficiently rapid to insure a substantially complete discharge of capacitor 158 before the arrival of the next clock pulse which will trigger transistor 154. That is, capacitor 158 discharges before the energy stored in transformer 165 is dissipated and transistor 154 can be retriggered. Therefore, the charging and discharging of capacitor 158 must be repeated on each cycle of operation of divider 151.

When it is desired to advance the counter of FIG. 5, a negative-going count pulse is applied to input terminal 166 of sufficient duration to overlap $n$ successive clock pulse periods. This count pulse is applied to AND gate 167 together with negative-going reference phase pulses from reference phase divider 150. The output of AND gate 167 therefore comprises the count pulse indexed in the reference phase.

Each output pulse from AND gate 167 is of such a magnitude and polarity as to restore the charge on capacitor 158 previously removed by diode 160 and resistor 162. When transistor 154 is next triggered, capacitor 158 is already fully charged, diode 157 will be reverse-biased, and resistor 159 will comprise the total effective emitter load. Under this condition, transistor 154 conducts a smaller amount of current than before and less energy is stored in the field of transformer 165. When transistor 154 again turns off, less time will be required to dissipate the energy in the field of transformer 165 and divider 151 will be able to retrigger in an earlier clock phase. The number of phase positions advanced can be adjusted by an appropriate choice of component values to whatever phase sequence is desired. Divider 151 will thereafter continue to trigger in the new phase until again advanced by an output from AND gate 167.

Divider 151 will continue to advance for each count pulse applied to terminal 166 until it has advanced through all of the possible phase positions and returns to the reference phase. On the next count pulse, not only will divider 115 be advanced, but AND gate 168 will also be fully enabled by the output of AND gate 167 and the negative-going output of divider stage 151. The output of AND gate 168 is used to advance divider 152 in the same manner as divider 151 is advanced. When divider 152 has advanced through a complete cycle of phase positions, it will, in turn, fully enable AND gate 169 to permit the advancement of the next succeeding divider stage. The final stage 153, of course, will be advanced one phase position for each full cycle of the next preceding divider stage.

The phase displacement counters of FIGS. 4 and 5 have relatively simple circuitry and hence are great advantage for counting pulse events, particularly for counting in the higher radix numbering systems such as decimal. One undesirable result of the change in emitter load, however, is the change in output pulse waveform each time a divider stage is advanced. The same mechanism which causes more or less energy to be stored in the transformer field also lengthens or shortens the pulse then being produced. While this result may be tolerated in many cases, it is a distinct disadvantage.

Of more serious consequence is the propagation delays which accumulate when the count pulse is used to drive a long string of AND gates with capactive loads. If there are too many stages in the counter, the later AND gates may not be enabled fast enough to enable the succeeding stage AND gate in the reference phase.

In addition, the counter of FIG. 4 which advances by increasing the length of the recovery interval, one clock pulse position is lost during each full cycle of the divider stage. If the count pulses arrive too rapidly, it may occur that the charge stored on the capacitor is not utilized before the next count pulse arrives. One obvious solution to this problem is to restrict the count pulse to every other reference phase position. Other solutions to this and the other problems discussed above are described with reference to the remaining figures.

Figure 6:
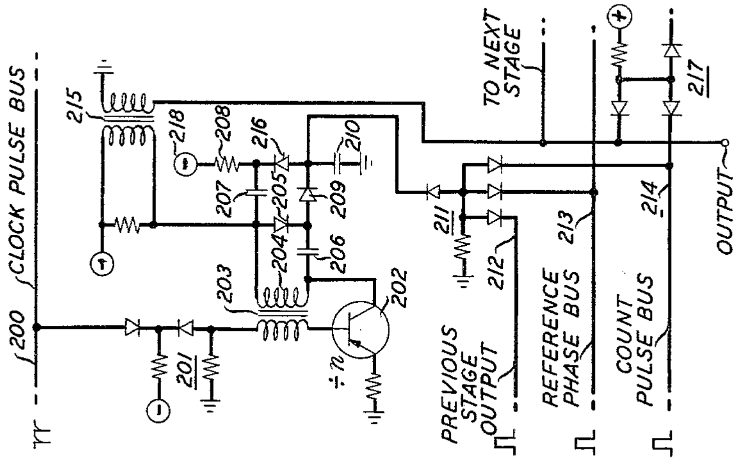
FIG. 6 is a schematic circuit diagram of a typical stage of a phase displacement counter including a decay circuit recovery time lengthening circuit.

In order to avoid the change in pulse waveform encountered in FIGS. 4 and 5, it is possible to change the dividing ratio of each divider stage by directly altering the impedance of the recovery circuit rather than by changing the amount of energy stored in the transformer field. In FIG. 6, for example, there is shown a typical stage of a phase displacement counter in which an advance in phase position is accomplished by increasing the impedance of the recovery circuit and thus reducing the recovery interval to advance the counter stage. In order to avoid propagation problems, the count pulses and the reference phase pulses are applied to all stages in parallel rather than in series.

Thus in FIG. 6 there is shown a typical stage of a phase displacement counter which shortens the normal recovery interval rather than lengthening it. The stage in FIG. 6 comprises a clock pulse bus 200 to which there are applied negative-going clock pulses. An isolation gate 201 applies these pulses to transistor 202 having a primary winding 204 of feedback transformer 203 connected to its collector electrode.

Connected across primary winding 204 is a discharge circuit comprising diode 205 and capacitor 206. A second capacitor 207 is connected from diode 205 through resistor 208 to negative voltage source 218. A second diode 209 is connected from capacitor 210 to the midpoint between diode 205 and capacitor 206. A diode 216 is connected from capacitor 210 to the midpoint of capacitor 207 and resistor 208. An AND gate 211 is connected between capacitor 210 and busses 212, 213 and 214, supplying the output of the previous stage, the reference phase, and the count pulse respectively. A positive-going output is taken from output transformer 215.

In operation, when transistor 202 fires, current builds up in winding 204. When transistor 202 cuts off, this current discharges through diode 205 and capacitor 206. Diode 205 is normallly forward-biased to provide a low impedance path and hence a long recovery interval.

When transistor 202 cuts off, its emitter tends to be driven negatively by the current in transformer 203. Diode 205 is forward-biased under this condition and the total effective impedance of the recovery circuit is low. The recovery interval will therefore be relatively long.

The flow of decay current through diode 205 builds up a charge on capacitor 206 in such a direction as ultimately to reverse bias diode 205. The impedance of the recovery circuit then increases radically and the recovery interval is rapidly terminated.

The next time transistor 202 is triggered on and conducts, its collector rises to near ground potential and carries the midpoint of capacitor 206 and diode 205 in a positive voltage direction. Eventually diode 209 becomes forward-biased and current flows from capacitor 206 to capacitor 210, removing the charge previously stored on capacitor 206. The recovery interval following this output pulse is of the same length as the previous one due to the discharge of capacitor 206. Thus capacitor 206 is charged and discharged during each cycle of the blocking oscillator. The charge transferred to capacitor 210 must be removed every cycle, however, to permit the removal of charge from capacitor 206 on every cycle. This occurs as follows:

At the end of each output pulse, the upper end of winding 204 falls to the negative voltage of the supply source. This negative-going transient is differentiated by capacitor 207 and resistor 208 and applied to diode 216 in such a direction as to forward-bias diode 216. The charge on capacitor 210 is therefore removed by current flow through diode 216 and resistor 208.

When it is desired to advance the state of the counter stage of FIG. 6, positive-going pulses appear simultaneously on leads 212, 213 and 214. Under this condition, AND gate 211 is fully enabled and a positive-charge is deposited on capacitor 210. This charge is sufficiently great to prevent diode 209 from becoming forward-biased during the next succeeding recovery interval. The charge on capacitor 206 is therefore not removed, and diode 205 remains in its high impedance, reverse-biased condition throughout most of the recovery interval. Under this condition, current in winding 204 is rapidly dissipated and the blocking oscillator circuit recovers more rapidly than before. It then counts in a new, earlier phase, the charge on capacitor 210 being removed during the next recovery interval as before.

Figure 7:
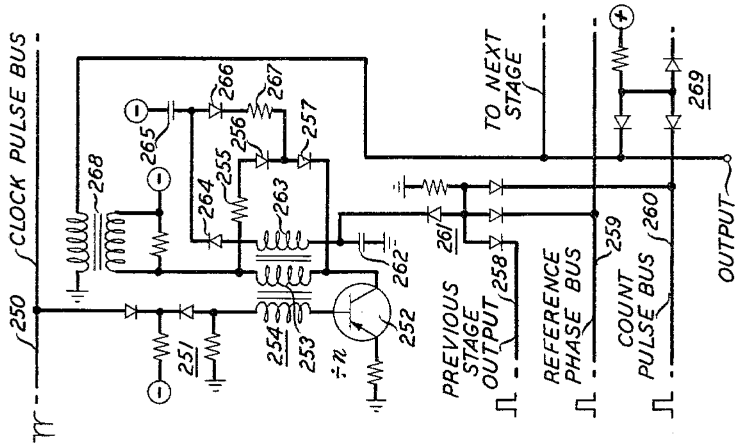
FIG. 7 is a schematic circuit diagram of a typical stage of a phase displacement counter including a third transformer winding for decay circuit recovery time shortening.

A positive-going output of the stage of FIG. 7 from output transformer 215 is connected to AND gate 217 to provide a count pulse for the next succeeding stage.

A similar circuit for transferring the advance command to the recovery circuit is shown in FIG. 7. Thus in FIG. 7 there is shown a typical stage of a phase displacement counter comprising a clock pulse bus 250 to which clock pulses are applied by way of isolation gate 251. These clock pulses trigger transistor 252 into conduction to rapidly build up current through primary winding 253 of feedback transformer 254. A resistor 255 and diodes 256 and 257 are connected across primary winding 253 to provide a normal low impedance discharge path for current in winding 253.

When positive-going pulses appear simultaneously on the previous stage output lead 258, the reference phase bus 259 and the count pulse bus 260, AND gate 261 is fully enabled and deposits a positive charge on capacitor 262.

The next time transistor 252 fires, the auxiliary winding 263, coupled to primary winding 253, develops a voltage which forward-biases diode 264 and transfers the charge from capacitor 262 to capacitor 265. When transistor 252 cuts off, the positive charge on capacitor 265 reverse-biases diode 256 through diode 266 and resistor 267. The decay circuit under this condition is of high impedance and includes diode 257, resistor 267, diode 266, capacitor 265, the negative voltage source, and the primary winding of output transformer 268. This high impedance path rapidly reduces the current in primary winding 253, providing a shorter recovery interval. The output from transformer 268 is applied to an AND gate 269 to provide a count pulse for the next succeeding stage.

Figure 8:
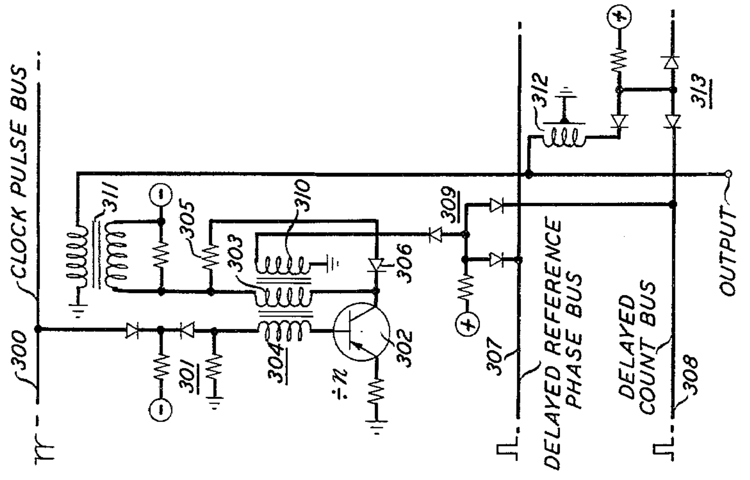
FIG. 8 is a schematic circuit diagram of a typical stage of a phase displacement counter including a third transformer winding for recovery time modification during the reference phase.

All of the circuits heretofore described for altering the division ratio of blocking oscillator pulse dividers have depended on capacitor storage of the advance command from the time of the reference phase pulse to the time when that stage fires. This time can be be anywhere from zero to $(n-1)$ clock pulse periods. For large division ratios, it may not be possible to store this command accurately for the required intervals. FIG. 8 discloses a circuit arrangement for using the advance command immediately.

In FIG. 8 there is shown a typical stage of a phase displacement counter in which the advance command is used immediately to alter the division ratio. The stage of FIG. 8 comprises a clock pulse bus 300 from which clock pulses are applied, via isolation gate 301, to the base of transistor 302. When triggered into conduction, transistor 302 rapidly builds up a current through primary winding 303 of feedback transformer 304. This current is discharged through resistor 305 and diode 306 when transistor 302 is cut off.

When it is desired to advance the counter stage of FIG. 8, simultaneous positive-going pulses appear on reference phase bus 307 and count pulse bus 308. Under this condition, AND gate 309 is fully enabled and a pulse of current flows through auxiliary winding 310, coupled to primary winding 303. Depending on the relative winding senses of windings 303 and 310, this current pulse will induce a voltage in winding 303 which will tend to reduce the decay current or which will tend to increase the decay current. The recovery interval will therefore be reduced or increased correspondingly.

In order to prevent an advance command from enabling AND gate 309 during the "on" state of transistor 302, the reference phase pulses are delayed for a fraction of a clock pulse interval so as to follow the appearance of output pulses from the stages. The output of the stage of FIG. 8 from output transformer 311 must therefore also be delayed by the same amount in delay circuit 312 before being applied to AND gate 313 to provide the delayed count pulse for the next succeeding stage.

It is to be understood that the above-described arrangements are merely illustrative of the numerous and varied other arrangements, both for the control of transistor blocking oscillator pulse dividers and for other types of pulse dividers, which are readily apparent to those skilled in the art. Such other arrangements may readily be devised by those skilled in the art without departing from the spirit or scope of this invention.

What is claimed is:

1. A phase displacement counter for providing a plurality of digit pulse trains the phases of which represent corresponding digit values, said counter comprising a plurality of pulse divider stages, each said stage including means for dividing an incoming pulse train by the radix of the selected numbering system, a source of clock pulses, means for applying said clock pulses directly to each of said stages, and means for increasing the digit value represented by the pulse train from each of said stages in response to the coincidence of a preselected phase of the preceding stage and an event to be counted, said increasing means including means for altering the phase of the output pulse train from that stage by a fixed number of said clock pulse periods regardless of the previous phase of said output pulse train.

2. The phase displacement counter according to claim 1 wherein said phase-altering means comprises means for temporarily changing the division ratio of that stage by an integer equal to said fixed number.

3. The phase displacement counter according to claim 2 wherein said phase-altering means comprises means to increase said division ratio.

4. The phase displacement counter according to claim 2 wherein said phase-altering means comprises means to decrease said division ratio.

5. The phase displacement counter according to claim 2 wherein said phase-altering means comprises means to alter said division ratio by an integer which is not an integral factor of, and has no common integral factor, with, said radix.

6. A phase displacement counter comprising a plurality of blocking oscillator pulse dividers, each of said pulse dividers being arranged normally to divide an incoming pulse train by the same integral ratio, a source of clock pulses, means for applying said clock pulses directly to each of said pulse dividers, and means for altering the dividing phase of each of said pulse dividers by a fixed number of said clock pulse periods less than said integral ratio when the next preceding pulse divider is providing output pulses in a preselected phase and an event to be corrected occurs.

7. The phase displacement counter according to claim 6 wherein said altering means comprises means for temporarily modifying the amount of current flowing through said blocking oscillator when it is conducting.

8. The phase displacement counter according to claim 6 wherein said altering means comprises means for temporarily modifying the impedance of the discharge path through which current conducted by said blocking oscillator must flow.

9. A pulse divider for producing output pulse trains in a regular repetitive sequence of phases of an input train in response to an advancing signal, said pulse divider having two alternating states of operation, reactive storage means, means for transferring energy into said reactive storage means during one of said states, means for transferring energy from said reactive storage means during the other of said states, said pulse divider being responsive to the coincidence of one of said input pulses and a preselected level of energy in said reactive storage means for triggering from one of said states to the other, and means for advancing the phase of the output pulse train from said pulse divider, said advancing means comprising means responsive to said advancing signal for temporarily altering the rate of flow of said energy during one of said states.

10. The phase displacement counter stage according to claim 9 wherein said advancing means comprises means for temporarily altering the amount of energy stored in said reactive storage means.

11. The phase displacement counter stage according to claim 10 wherein said altering means comprises means for increasing the amount of energy stored in said reactive storage means.

12. The phase displacement counter stage according to claim 10 wherein said altering means comprises means for decreasing the amount of energy stored in said reactive storage means.

13. The phase displacement counter stage according to claim 9 wherein said advancing means comprises means for temporarily altering the rate of transferring said energy from said storage means.

14. The phase displacement counter stage according to claim 13 wherein said altering means comprises means for increasing the rate of operation of said transferring means.

15. The phase displacement counter stage according to claim 13 wherein said altering means comprises means for decreasing the rate of operation of said transferring means.

16. A pulse divider responsive to an input pulse train for producing a selectively-phased divided output pulse train, said pulse divider comprising a blocking oscillator, said blocking oscillator including an amplifying device and a feedback transformer, said feedback transformer coupling the output of said amplifying device to the input of said amplifying device in regenerative relation, load means coupled to said amplifying device, discharge means coupled to said feedback transformer for dissipating energy stored in said transformer, a source of said input pulse train, said amplifying device being disabled until the coincidence of one of said input pulses and a preselected energy level in said feedback transformer, and means for altering the phase of said output pulse train comprising means for altering the duration of time before said energy reaches said preselected level by an integral number of periods of said input pulses.

17. The pulse divider according to claim 16 wherein said load means includes a capacitor and a diode connected in series, said diode being poled to be biased in the reverse direction by the charge built up on said capacitor when said amplifying device is enabled, and said altering means includes means for controlling said charge on said capacitor.

18. The pulse divider according to claim 16 wherein said discharge means comprises a capacitor and a diode connected in series across said feedback transformer, said diode being poled to be biased in the reverse direction by the charge built up on said capacitor when energy stored in said feedback transformer is being dissipated, and said altering means includes means for controlling said charge on said capacitor.

19. The pulse divider according to claim 16 wherein said discharge means comprises a pair of unidirectionally conducting discharge paths for energy stored in said feedback transformer, and means for selectively enabling only one of said discharge paths.

20. A phase displacement counter for providing a plurality of digit pulse trains the phases of which represent corresponding digit values, said counter comprising a plurality of pulse divider stages for dividing an incoming pulse train by the radix of the selected numbering system, each said stage having two alternating states of operation and comprising reactive storage means, means for transferring energy into said reactive storage means during one of said states, means for transferring energy from said reactive storage means during the other of said states, a source of clock pulses, means for applying said clock pulses directly to each of said stages, said pulse divider stages being responsive to the coincidence of one of said clock pulses and a preselected level of energy in said reactive storage means for triggering from one of said states to the other, and means for increasing the digit value represented by the pulse train from each of said stages in response to the coincidence of a preselected phase of the preceding stage and an event to be counted, said increasing means including means for altering the phase of the output pulse train from that stage by a fixed number of said clock pulse periods by altering the rate of flow of said energy during one of said states.

21. A phase displacement counter comprising a plurality of blocking oscillator pulse dividers each of said pulse dividers being arranged normally to divide an incoming pulse train by the same integral ratio, a source of clock pulses, means for applying said clock pulses directly to each of said pulse dividers, each of said blocking oscillator pulse dividers including an amplifying device and a feedback transformer, said feedback transformer coupling the output of said amplifying device to the input of said amplifying device in regenerative relation, load means coupled to said amplifying device, discharge means coupled to said feedback transformer for dissipating energy stored in said transformer, said amplifying device being disabled until the coincidence of one of said clock pulses and a preselected energy level in said feedback transformer, and means for altering the dividing phase of each of said pulse dividers by a fixed number of said clock pulses less than said integral ratio when the next preceding pulse divider is providing output pulses in a preselected phase and an event to be counted occurs, said altering means including means for changing the duration of time before said energy reaches said preselected level by an integral number of periods of said clock pulses.

References Cited by the Examiner

UNITED STATES PATENTS

| | | | |
|---|---|---|---|
| 2,585,722 | 2/1952 | Baird | 328—40 X |
| 2,740,047 | 3/1956 | Bayliss | 328—40 X |
| 2,905,906 | 9/1959 | Kittl | 331—181 |
| 2,939,081 | 5/1960 | Dennis | 328—122 |
| 2,959,744 | 11/1960 | Wengryn | 331—181 |
| 3,011,110 | 11/1961 | Yu-Chi Ho et al. | 318—28 |
| 3,084,859 | 4/1963 | Smith | 235—92 |
| 3,108,198 | 10/1963 | Lentz | 328—40 X |

ARTHUR GAUSS, *Primary Examiner.*

MALCOLM A. MORRISON, *Examiner.*

Disclaimer 3,239,765.—*Robert L. Carbrey*, Madison, N.J. PHASE SHIFT COUNTING CIRCUITS. Patent dated Mar. 8, 1966. Disclaimer filed Sept. 2, 1971, by the assignee, *Bell Telephone Laboratories, Incorporated.*

Hereby enters this disclaimer to all claims of said patent.

[*Official Gazette December 21, 1971.*]